(12) United States Patent
Altmann

(10) Patent No.: US 7,885,368 B2
(45) Date of Patent: *Feb. 8, 2011

(54) ANALOG PHASE CONTROLLER

(75) Inventor: Michael Altmann, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 761 days.

This patent is subject to a terminal disclaimer.

(21) Appl. No.: 11/479,411

(22) Filed: Jun. 30, 2006

(65) Prior Publication Data

US 2008/0002800 A1    Jan. 3, 2008

(51) Int. Cl.
H03D 3/24    (2006.01)
(52) U.S. Cl. .................................................. 375/375
(58) Field of Classification Search ......... 375/373–376; 327/146; 331/17
See application file for complete search history.

(56) References Cited

U.S. PATENT DOCUMENTS 7,498,889 B2 *  3/2009  Altmann ...................... 331/17
2003/0123589 A1  7/2003  Glenn et al.
2005/0046456 A1 *  3/2005  d'Haene et al. ............. 327/165
2006/0013349 A1 *  1/2006  Koh et al. .................... 375/376
2006/0285618 A1 *  12/2006  Shoor ......................... 375/373
2007/0153951 A1 *  7/2007  Lim et al. .................... 375/376

OTHER PUBLICATIONS

Kreienkamp, Rainer et al., "A 10-Gb/s CMOS Clock and Data Recovery Circuit With an Analog Phase Interpolator," IEEE Journal of Solid State Circuits, Mar. 2005, pp. 736-743, vol. 40 No. 3.
Maxim, Adrian, "A 160-2550MHz CMOS Active Clock Deskewing PLL Using Analog Phase Interpolation," 2004 IEEE International Solid-State Circuits Conference, Feb. 18, 2004.

* cited by examiner

*Primary Examiner*—Don N Vo
(74) *Attorney, Agent, or Firm*—Erik R. Nordstrom

(57) ABSTRACT

Disclosed are embodiments of a phase control circuit with an analog phase controller that is able to effectively generate control signals for all four quadrants of phase control operation.

5 Claims, 3 Drawing Sheets

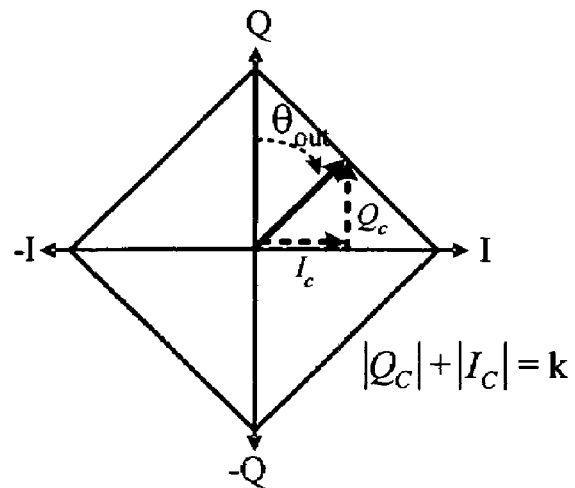
FIGURE 4A
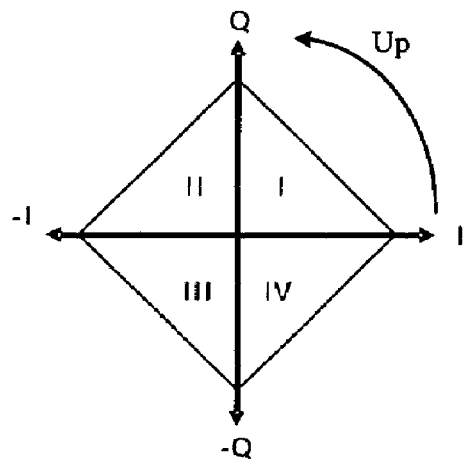
FIGURE 4B
| Quadrant | Up | | Down | |
|---|---|---|---|---|
| | $I_C$ | $Q_C$ | $I_C$ | $Q_C$ |
| I | ↓ | ↑ | ↑ | ↓ |
| II | ↓ | ↓ | ↑ | ↑ |
| III | ↑ | ↓ | ↓ | ↑ |
| IV | ↑ | ↑ | ↓ | ↓ |
FIGURE 4C

US 7,885,368 B2

ANALOG PHASE CONTROLLER

BACKGROUND

Phase control circuits are used in a variety of applications such as in transceivers to synthesize clock signals or to recover data from a data stream in a clock and data recovery (CDR) application. They typically use a voltage controlled oscillator (VCO) or a phase interpolator (PI) to generate an output signal with a controllable phase angle (or phase).

PI type phase control circuits may be digital or analog. Digital PI-based circuits typically control a phase interpolator with one or more digital words having a fixed number of possible values. They can perform well but may be limited due, for example, to their limited resolution, which can make it difficult to use them in higher frequency applications. On the other hand, analog PI controllers have better phase control resolution but may have other drawbacks such as they may have problems with full 360° phase-control operation. Accordingly, an improved PI phase control solution is desired.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4A is a diagram showing the relationship between output phase values and applied control values in accordance with some embodiments.

FIG. 4B is a diagram showing relative output angle direction for four-t quadrant operation.

FIG. 4C is a table showing in-phase and quadrature control charge directions for up and down phase rotation.

DETAILED DESCRIPTION

Figure 1:
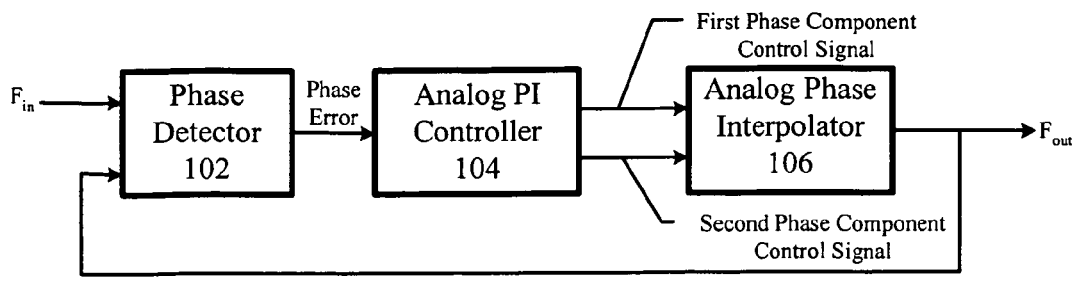
FIG. 1 is a block diagram of a PI-type phase control circuit in accordance with some embodiments.

With reference to FIG. 1, a block diagram of a phase interpolator (PI) type phase control circuit is shown. It generally comprises a phase detector 102 coupled to an analog PI controller 104, which in turn is coupled to an analog phase interpolator 106 to generate an output frequency signal ($F_{out}$) having a phase that tracks the phase of an input frequency signal ($F_{in}$). The output signal ($F_{out}$) is fed back to the phase detector for closed loop phase tracking against the input frequency signal ($F_{in}$). The phase detector produces a phase error signal indicating the phase relationship between the input and output frequency signals (e.g., whether the phase of the fed-back output signal leads or lags the input signal).

The PI controller 104 controls the phase of the output frequency signal based on the received phase error signal, i.e., it decreases (moves back or down) the output signal phase if it leads the input signal phase and increases (moves up or forward) the output signal phase if it lags the input signal phase. It uses the first and second control signals to control the output phase. Together, the first and second control signals identify a phase angle between 0 and 360 degrees. In some embodiments, because they are analog signals controlling an analog phase interpolator 106, high phase resolution may be achieved over the entire 360 degree range of operation. Depending on the particular phase interpolator being used, any suitable scheme (e.g., linear, sinusoidal) may be implemented for the control signals.

(It should be noted that the phase error signal may comprise one or more signals indicating whether the output frequency phase is ahead of or behind the input signal's phase. For example, it could comprise a single signal with its polarity indicating the phase relationship. Alternatively, as is the case below with reference to FIGS. 2 and 3, it could comprise first and second signals (e.g., signal pulses) indicating whether the output phase leads or lags the input phase depending on which of the first and second signals is asserted.)

Figure 2:
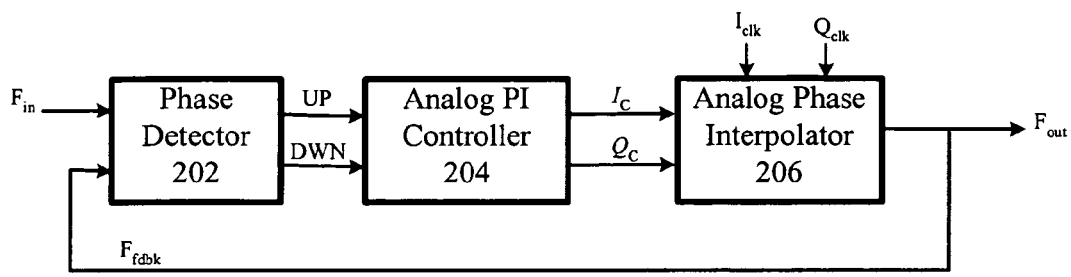
FIG. 2 is a block diagram of a PI-type phase control circuit in accordance with some embodiments of the phase control circuit of FIG. 1.

FIG. 2 shows a more detailed embodiment of a phase control circuit in accordance with some embodiments of the circuit of FIG. 1. It comprises a phase detector 202, analog PI controller 204, and an analog phase interpolator 206, all coupled together as indicated to generate the phase-controlled output frequency signal ($F_{out}$). The phase detector generates a phase error signal comprising UP and DWN phase direction signals indicating whether the output signal phase is behind or ahead of the input signal phase. In some embodiments, the UP signal pulses when the output phase lags the input phase, the DWN signal pulses when the output phase leads the input phase, and neither pulses when they are sufficiently equivalent.

The analog phase interpolator 206 uses applied in-phase and quadrature-phase reference clocks ($I_{clk}$, $Q_{clk}$) to generate the output frequency signal. The $I_{clk}$ and $Q_{clk}$ signals are 90° out of phase from one another, and their frequencies are intended to be the same as that of the input frequency signal (Fin). The analog phase controller 204 generates analog in-phase ($I_C$) and quadrature-phase ($Q_C$) control signals to control the phase of the output signal generated by the phase interpolator. They essentially control the portion of $I_{clk}$ and $Q_{clk}$ signals that contribute to the resultant output frequency signal ($F_{out}$). In some embodiments, the $I_{clk}$ and $Q_{clk}$ reference signals approximate triangle wave clocks. With triangle wave clocks, linearly weighted control values, instead, for example, of the more common cosine-weighted values, may be employed.

With reference to FIG. 4A, a diagram indicating the linear relationship between the output phase angle (θout) and the control values, $I_C$ and $Q_C$, is shown. As indicated, with the sum of the magnitudes of $I_C$ and $Q_C$ maintained reasonably constant (k), full 360 degree phase control can be achieved using different value combinations of $I_C$ and $Q_C$, including both positive and negative values. With additional reference to FIG. 4B, the phase controller 204 controls the control values ($I_C$, $Q_C$) to adjust the output phase angle (θout) to increase (counter-clockwise in depicted diagram) or decrease (clockwise in depicted diagram). By knowing the polarities of the control signals (as well as when they change), it can decode quadrant location for the output phase angle and thus know whether the control ($I_C$, $Q_C$) magnitudes should increase or decrease when moving from one quadrant to the next. The table of 4C indicates charging directions for the $I_C$ and $Q_C$ phase control signals in FIG. 3.

Figure 3:
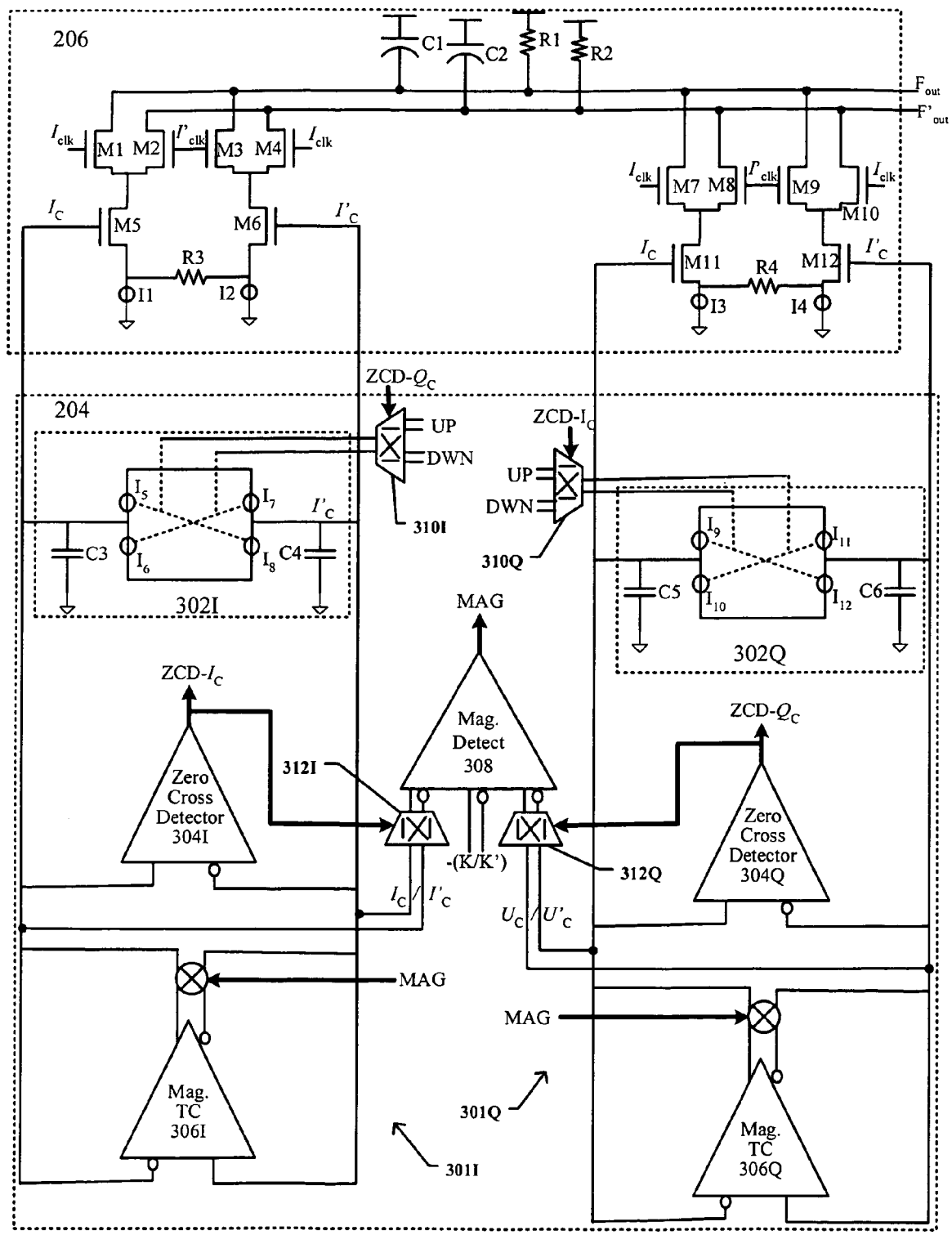
FIG. 3 is a schematic diagram of a phase interpolator with an analog controller in accordance with some embodiments of the circuits of FIGS. 2 and 1.

FIG. 3 shows a more detailed circuit embodiment of the analog phase controller 204 and analog phase interpolator 206 for the phase control circuit of FIG. 2. The PI controller 204 uses charge pump integrators to convert from the phase detector UP/DWN signals to the control signals ($I_C/I_C'$ and $Q_C/Q_C'$). It uses these control signals to control the phase of a differential output signal ($F_{out}/F'_{out}$) generated by the phase interpolator 206.

The phase interpolator 206 generally comprises differential in-phase (I) and quadrature-phase (Q) drivers coupled together at their outputs to provide the differential output frequency signal ($F_{out}/F'_{out}$). The I driver is formed from NMOS transistors M1 to M6, resistor R3, and current sources I1 and I2, coupled together as indicated. Similarly, the Q driver is formed from transistors M7 to M12, resistor R4, and current sources I3 and I4, coupled together as indicated. The I and Q drivers share filter capacitors C1, C2 and bias/pull-up resistors R1, R2 coupled between their differential output lines and supply power as shown.

(The term "NMOS transistor" refers to an N-type metal oxide semiconductor field effect transistor. Likewise, the term "PMOS transistor" refers to a P-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

Transistors M5, M6, resistor R3 and current sources I1, I2 form a differential driver circuit with its differential input coupled to the in-phase control signal ($I_C/I'_C$) from the PI controller 204. The output of this driver (at the drains of M5 and M6) is coupled to the output frequency signal lines ($F_{out}/F'_{out}$) through transistors M1 to M4, which receive at their inputs the differential in-phase reference clock ($I_{clk}/I'_{clk}$) as indicated. Transistors M1 to M4 function as switches to essentially modulate the in-phase control signal ($I_C/I'_C$) onto the in-phase reference clock ($I_{clk}$). In this way, the amount of $I_{clk}$ contributing to the overall output frequency signal ($F_{out}/F'_{out}$) can be controlled by the value of the $I_C$ control signal ($I_C/I'_C$). The Q driver functions essentially the same way, except that instead of working with the in-phase (I) signals, it modulates the quadrature-phase control signal ($Q_C/Q'_C$) onto the quadrature-phase reference clock ($Q_{clk}/Q'_{clk}$). The resultant clocks are then combined and filtered at the output lines ($F_{out}/F'_{out}$) and provided as the output frequency signal.

The PI controller 204 comprises an in-phase (I) section 301I, a quadrature-phase (Q) section 301Q, and a magnitude detector circuit 308 with differential polarity switches 312I, 312Q, all coupled to one another as shown. Because the I and Q sections (301I, 301Q) are configured substantially the same, for the sake of brevity, only the I section 301I will be discussed in detail. Before addressing the I section 301I, however, the magnitude detector 308 will be addressed.

The magnitude detector 308 comprises an analog summing circuit with differential inputs. It receives as operands the IC/I'C and QC/Q'C control signals (from the I and Q sections) coupled through diff. polarity switches 312I, Q, along with a negative K/K' value. It sums these values together to identify, pursuant to the constraint that the sum of the magnitudes of $I_C$ and $Q_C$ be constant, whether the sum of $I_C/I'_C$ and $Q_C/Q'_C$ is greater or less than K/K'. This is indicated by the MAG signal at its output. The diff. polarity switches 312I,Q are controlled by ZCD-$I_C$ and ZCD-$Q_C$ to ensure that the signs of $I_C/I'_C$ and $Q_C/Q'_C$ are correct, regardless of their quadrant location, to properly implement the summation. The MAG signal is provided to the magnitude correction transconductors 306I,Q in the I and Q sections to control the magnitudes of $I_C/I'_C$ and $Q_C/Q'_C$ to substantially maintain their sum constant pursuant to the constraint.

The I section 301I comprises a charge pump circuit 302I, zero cross detector 304I, magnitude correction circuit 306I, and differential polarity switch 310I, all coupled together as shown.

The charge pump circuit 302I is formed from current sources/sinks I3 to I6 and integrating capacitors C3 and C4. Its differential output is coupled to the $I_C/I'_C$ signal. Depending on whether current source/sink I5/I8 or I6/I7 are turned on, it either charges or discharges, respectively, $I_C/I_C'$ so that it can range between a positive and negative value. (In some embodiments, it neither charges or discharges if both UP and DWN are inactive.) Capacitors C3 and C4 function as integrators, holding the charge and filtering noise from the $I_C/I'_C$ signal.

The UP and DWN signals are coupled to charge pump 302I through differential polarity switch 310I to control whether it charges, discharges or holds the $I_C/I'_C$ signal. (As used herein, a differential polarity switch comprises one or more multiplexers, or other suitable circuitry, to switch the polarities of one or more input differential signals as they are applied to an input of another circuit in response to a control signal.) The diff. polarity switch 310I, in response to applied control signal (ZCD-$Q_{C\ from\ the\ Q\ section\ 301Q}$), controls the polarities of the UP and DWN signals as they are applied to the charge pump to generate the $I_C/I'_C$ signal. The ZCD-$Q_C$ signal is a digital signal indicating whether the $Q_C/Q'_C$ signal is positive or negative. Thus, it controls the charge pump 302I to appropriately charge or discharge based on the currently occupied quadrant. The table of FIG. 4C shows charging directions (charging up or charging down) for up and down angular rotations as indicated.

The zero cross detector 304I essentially comprises a suitably fast comparator or diff. amplifier with sufficiently low offset. Its inputs are coupled to the $I_C/I'_C$ signal to indicate at its output (ZCD-$I_C$) the sign of the $I_C/I'_C$ control signal. The ZCD-$Q_C$ signal is provided to the diff. polarity switch 310Q in the Q section 301Q to similarly control charge pump 302Q as the ZCD-$I_C$ signal controls charge pump 302I. The ZCD-$I_C$ signal is also provided to diff. control switch 312I to control the polarity of the $I_C/I'_C$ signal as it is applied to the magnitude correction detector 308.

The magnitude correction amplifier 306I controls the magnitude of the $I_C/I'_C$ value. It receives a digital control signal (MAG) from the magnitude detection circuit 308 indicating whether the sum of the $I_C$ and $Q_C$ magnitudes are too small or too large. Depending on the value of MAG, it either charges or discharges (increases or decreases the voltage difference across) the $I_C/I'_C$ signal in order to counter, for example, the effects of charge pump leakage and UP/DWN mismatch.

With the use of a negative feedback transconductor amplifier, the amount that $I_C/I'_C$ and $Q_C/Q'_C$ is altered is proportional to its present value thereby preventing the $I_C/I'_C$ value from being excessively changed too quickly. The magnitude control loop (taking into account the magnitude detector and both the I and Q magnitude correction transconductors) may dither about it's final settling point, but this should not affect the phase of the output signal ($F_{out}/F'_{out}$) since the sum of $I_C/I'_C$ and $Q_C/Q'_C$ is held substantially constant.

Again, the Q section 301Q is substantially the same as the I section 001I and operates symmetrically to it. It generates the $Q_C/Q'_C$ control signal (instead of the $I_C/I'_C$ signal). Its magnitude correction circuit operates essentially the same as that from the I section except that it, of course, operates on the $Q_C/Q'_C$ signal rather than the $I_C/I'_C$ signal.

Accordingly, the phase controller 204 of FIG. 3 can generate $I_C$ and $Q_C$ control signals to effectively control the phase interpolator 206. It efficiently uses the UP and DWN signals as inputs to its charge pumps to generate the control signals, and it effectively controls the control signals in all quadrants by efficiently decoding quadrant location based on detected signs of the control signals themselves.

Figure 5:
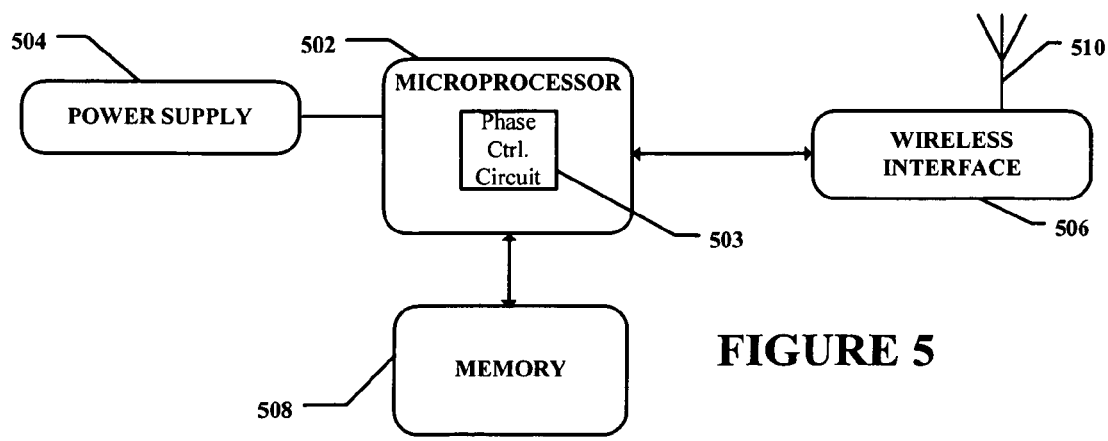
FIG. 5 is a block diagram of a computer system having a microprocessor with at least one phase control circuit in accordance with some embodiments.

With reference to FIG. 5, one example of a computer system is shown. The depicted system generally comprises a processor 502 that is coupled to a power supply 504, a wireless interface 506, and memory 508. It is coupled to the power supply 504 to receive from it power when in operation. The wireless interface 506 is coupled to an antenna 510 to communicatively link the processor through the wireless interface chip 506 to a wireless network (not shown). The microprocessor 502 comprises one or more phase control circuits 503 such as are disclosed herein for CDR and/or other applications.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A circuit, comprising:
 a phase detector circuit to receive an input frequency signal and a fedback output frequency signal and to generate at least one phase error signal to indicate a phase relationship between said input and output frequency signals;
 a phase interpolator to generate the output frequency signal; and
 a control circuit coupled to the phase interpolator and to the phase detector to control the phase of the output frequency signal based on the at least one phase error signal, the control circuit comprising first and second charge pumps coupled to the at least one phase error signal to generate first and second control signals coupled to the phase interpolator to control the phase of the output frequency signal, wherein the first charge pump is coupled to a first phase direction signal from the phase detector and the second charge pump is coupled to a second phase direction signal from the phase detector, and the control circuit is to control the first control signal based on the sign of the second control signal and to control the second control signal based on the sign of the first control signal.

2. The circuit of claim 1, in which the first and second control signals are differential signals to be generated by differential first and second charge pumps, respectively.

3. The circuit of claim 1 in which the control circuit further comprises:
 a first zero crossing detector to detect the sign of the second control signal and to control the polarity of the coupled first phase direction signal based on the detected sign of the second control signal, and
 a second zero crossing detector to detect the sign of the first control signal and to control the polarity of the coupled second phase direction signal based on the detected sign of the first control signal.

4. The circuit of claim 1, in which the first and second control signals each have an associated magnitude, wherein the sum of said magnitudes are controlled to be substantially equivalent to a constant value.

5. The circuit of claim 4, further comprising a first magnitude control circuit coupled to the first charge pump to control the magnitude of the first control signal and a second magnitude control circuit coupled to the second charge pump to control the magnitude of the second control signal.

* * * * *